United States Patent
Sonsky

(10) Patent No.: US 7,897,478 B2
(45) Date of Patent: Mar. 1, 2011

(54) SEMICONDUCTOR DEVICE WITH FIELD PLATE AND METHOD

(75) Inventor: Jan Sonsky, Leuven (BE)

(73) Assignee: NXP B.V., Eindhoven (NL)

(*) Notice: Subject to any disclaimer, the term of this patent is extended or adjusted under 35 U.S.C. 154(b) by 130 days.

(21) Appl. No.: 12/158,136

(22) PCT Filed: Dec. 18, 2006

(86) PCT No.: PCT/IB2006/054927
§ 371 (c)(1),
(2), (4) Date: Jun. 19, 2008

(87) PCT Pub. No.: WO2007/072405
PCT Pub. Date: Jun. 28, 2007

(65) Prior Publication Data
US 2008/0296694 A1    Dec. 4, 2008

(30) Foreign Application Priority Data
Dec. 22, 2005    (EP) ................................. 05112801

(51) Int. Cl.
*H01L 21/76* (2006.01)
(52) U.S. Cl. ................ 438/424; 438/151; 438/296; 438/454; 257/E21.409; 257/E21.54
(58) Field of Classification Search ........... 438/159, 438/223, 405, 449, 451, 453, 454; 257/E21.457
See application file for complete search history.

(56) References Cited

U.S. PATENT DOCUMENTS

| 4,437,226 A | 3/1984 | Soclof |
| 5,719,423 A | 2/1998 | Todd et al. |
| 2005/0167749 A1* | 8/2005 | Disney .................. 257/341 |

FOREIGN PATENT DOCUMENTS

| DE | 10301939 A1 | 9/2004 |
| DE | 102004014928 A1 | 10/2005 |
| JP | 2003197909 A | 7/2003 |

OTHER PUBLICATIONS

Ratnam, P. "Novel Silicon-On-Insulator MOSFET for High-Voltage Integrated Circuits" IEE Electronics Letters, vol. 25, No. 8, Apr. 13, 1989, pp. 536-537.

* cited by examiner

*Primary Examiner*—Charles D Garber
*Assistant Examiner*—Cheung Lee

(57) ABSTRACT

A method of making a semiconductor device includes forming shallow trench isolation structures in a semiconductor device layer. The shallow trench isolation structures are U- or O- shaped enclosing field regions formed of the semiconductor device layer which is doped and/or silicided to be conducting. The semiconductor device may include an extended drain region or drift region and a drain region. An insulated gate may be provided over the body region. A source region may be shaped to have a deep source region and a shallow source region. A contact region of the same conductivity type as the body may be provided adjacent to the deep source region. The body extends under the shallow source region to contact the contact region.

32 Claims, 15 Drawing Sheets

SEMICONDUCTOR DEVICE WITH FIELD PLATE AND METHOD

The invention relates to a semiconductor device with a field plate and a method of manufacture of such a device, and particularly but not exclusively to a field effect transistor (FET) with a field plate.

There are a number of applications for semiconductor devices, for example transistors, which require the integration of components capable of dealing with moderate or high voltage or significant electrical power with conventional logic circuits. In particular, power management and amplification chips, display drivers and automotive applications may require such semiconductor devices.

Typically, such components require voltages of 20 to 100V, perhaps even more. The devices used may be reduced surface field (RESURF) devices. Such devices include field effect transistors (FETs) with adjustments such as field plates adjacent to drift regions to deplete the drift region with the transistor off to increase the breakdown voltage compared with the same transistor without the field plates.

Unfortunately, the techniques used to make the RESURF devices require the use of additional process steps to integrate them with conventional devices such as standard advanced logic complementary metal oxide semiconductor (CMOS).

An example of a prior art high voltage transistor is provided by U.S. Pat. No. 6,635,544 (Disney), which describes a number of high voltage structures. One of these is a lateral FET formed on a buried layer with a plurality of relatively lightly doped longitudinally extending drift regions between the body and the drain of the FET. Insulated field plates extend in parallel on either side of the drift regions to deplete the drift regions when a voltage is applied to the field plates. This allows the transistor to withstand higher voltages between source and drain when the transistor is off.

This structure suffers from the problem mentioned above that the manufacture of the device is somewhat difficult and requires in particular additional process steps not used in standard CMOS. The field plates are formed by etching a trench, depositing a thick dielectric layer in the trench, filling the trench with conductor to form the field plates and then planarizing the trench. This means that if this structure is to be integrated with standard CMOS processes a considerable amount of increased complexity is introduced.

A further difficulty is that some of the steps of this design may not be compatible at all with modern CMOS processes. This is due to the thick dielectric oxide layer and conductive layer deposition, followed by the planarization. Modern CMOS processes require a very high degree of flatness for subsequent steps, and it is difficult or impossible to achieve this with the planarizing step.

It would therefore be beneficial to provide a method of manufacturing a high voltage device which can be readily integrated into a standard CMOS process, and the high voltage device thus formed.

According to a first aspect of the invention there is provided a method of manufacturing a semiconductor device according to claim 1.

In one embodiment the semiconductor device is a transistor, for example a power FET device having source, body, extended drain and drain regions arranged longitudinally in that order. The step of forming the active device may then comprise forming the source, body, extended drain and drain regions in the silicon device layer adjacent to the trenches, with the source and drain regions being longitudinally spaced, the body region being adjacent to the source region and the extended drain region extending longitudinally between the body region and the drain region past the field regions and separated from the field regions by the trenches filled with insulator; and forming an insulated gate over the body region.

Note that the term "power FET" is not intended to imply anything more than that the FET should be capable of higher voltage or power (or both) than low power logic FETs. Both the breakdown voltage and power may in fact be quite moderate—the invention is applicable to power FETs having breakdown voltages of 20V or even less.

In embodiments, the method is carried out on a device layer on insulator. In this case, the method of the invention need only use process steps available in conventional CMOS on silicon on insulator (SOI) technologies. Thus, it can be implemented on a standard process line using suitable masks and does not require any additional non-standard process steps at all. This is a major advantage in terms of cost and integration.

In alternative embodiments, after forming the plurality of trenches enclosing field regions, the method may include the steps of deepening the trenches to form deep trenches and filling the deep trenches with insulator. In this way, high voltage isolation can be achieved without needing a SOI substrate.

There are a number of alternative ways of rendering the field regions conductive. In one approach, the step of processing the field regions comprises heavily doping the field regions to render the field regions conductive.

Alternatively, the step of processing the field regions comprises siliciding the field regions to render the field regions conductive.

Either way, the field regions are formed in the original monocrystalline silicon of the silicon device layer and there is no need to fill a trench with polycrystalline silicon as in prior art approaches such as U.S. Pat. No. 6,635,544. Instead, trenches are used to define the insulated regions around the field regions.

In a preferred embodiment, the thickness of the silicon device layer is 200 nm or less, the width of the field region is 150 nm or less, down to the minimum possible in the process and the width of the trenches is 500 nm or less.

In order to ensure a body contact to relatively thin SOI substrates, the method of forming the source and body regions may include:

doping a body-forming region of the device throughout the thickness of the silicon device layer to have a first conductivity type, wherein the body-forming region includes at least the body region in the finished device;

doping a shallow source region of the device to a depth less than the thickness of the silicon device layer to have a second conductivity type opposite to the first conductivity type to form the shallow source region over part of the body-forming region; and doping a contact region of first conductivity type adjacent to the shallow source region and in contact with the body-forming region, to form a conductive contact region contacting the body-forming region and hence forming an electrical connection to the body region formed from the body-forming region in the transistor.

This deals with a particular problem related to a difference between low-power CMOS and power devices. In low power CMOS devices, the body region is often left floating. This is not ideal, but can be tolerated in such devices. In contrast, in higher power devices the body should be contacted. The process provides a means to connect to the p-type body region using the standard processing steps used in low-power CMOS devices providing a body contact without additional steps.

The method may include forming a strongly doped drain region by strongly doping the drain region to be conductive, leaving the region between the strongly doped drain region and the body-forming region as the extended drain region.

During the step of forming the strongly doped drain region, a deep source region may be formed throughout the thickness of the silicon device layer and in contact with the shallow source region. The deep and shallow source regions together make up the source region and the remainder of the body-forming region. i.e. the part between the source region and the extended drain region, forms the body region.

The method may include forming field plate contacts in contact with the field regions. The field regions can be connected to an external bias voltage in various ways including connection to parts of the source or body region using suitable layout of the doping masks.

The steps of the method are compatible with conventional CMOS processing and so the method may further include forming a plurality of conventional active CMOS devices on the same substrate using the same process steps. In this way, power devices can be formed on the same substrate as low-power CMOS without additional process steps and using a standard CMOS processing line.

The same step or steps may be used to form the power FET and to form the plurality of conventional active CMOS devices.

In another aspect, the invention relates to a semiconductor device according to claim 16.

In some embodiments the active device is a transistor. In one embodiment, the transistor includes a source region, a body region, an extended drain region and a drain region arranged longitudinally in that order in the semiconductor device layer, the body region being of opposite conductivity type to the source region and the drain region and the field regions extending longitudinally adjacent to the extended drain region.

In an embodiment, the source region includes a deep source region extending the full depth of the semiconductor device layer and a shallow source region of greater width than the deep source region at the first major surface, between the deep source region and the insulated gate, and the semiconductor device further includes comprising a conductive contact region of the same conductivity type as the body region extending through the semiconductor device layer adjacent to the deep source region, the body region extending under the shallow source region to the conductive contact region to electrically connect the body region to the conductive contact region.

In this way the device includes a contact to the body.

For a better understanding of the invention embodiments will now be described, purely by way of example, with reference to the accompanying drawings, in which.

Like or similar components are given the same reference numerals in different Figures and embodiments. The drawings are not to scale.

A method of manufacturing an NMOS transistor according to an embodiment of the invention will now be described.

Figure 1:
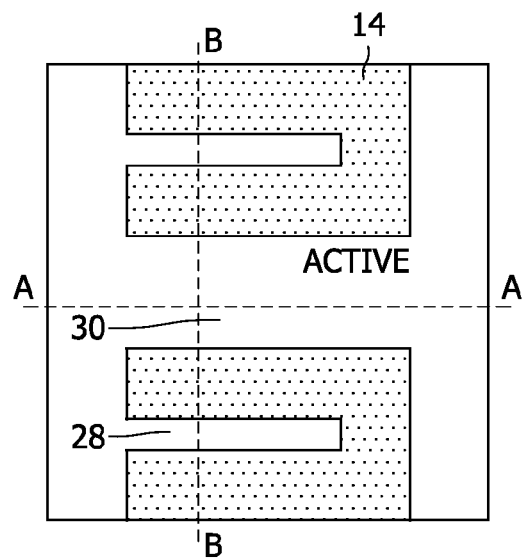
FIG. 1 shows a top view of a first stage in a first embodiment of a method according to the invention.
Figure 2:
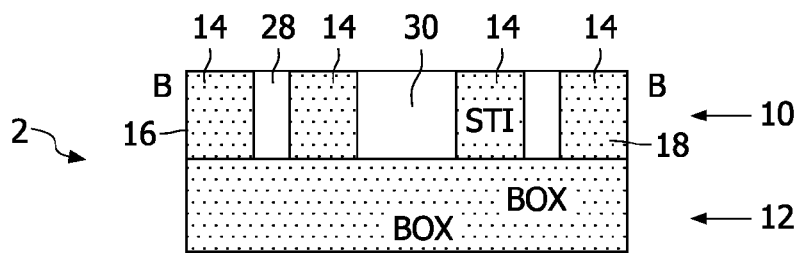
FIG. 2 shows a section through the stage of FIG. 1 along line B-B.

Firstly, a silicon on insulator (SOI) substrate 2 is provided, with a monocrystalline silicon device layer 10 formed over an insulating layer 12 as illustrated in FIGS. 1 and 2. In the embodiment, the insulating layer is a buried oxide layer but in alternative embodiments other silicon on insulator technologies such as silicon on sapphire could be used.

The silicon device layer 10 in the embodiment is 60 nm thick.

The first processing step is to form U-shaped insulating regions 14 as illustrated in FIG. 1 (top view) and FIG. 2 (side view). The U-shaped regions are formed using a conventional shallow trench isolation (STI) process from a conventional CMOS process flow which forms a shallow trench 16 and then fills it with oxide 18. The thickness of the silicon device layer 10 is sufficiently thin that the shallow trench isolation process forms a trench extending through the full thickness of the silicon device layer, and in this embodiment is 200 nm or less.

The centre of the U-shaped regions 14 will be referred to as a field region 28 in the following. The U-shapes 14 are oriented so that the arms of the U extend longitudinally, so the field region 28 between the arms also extends longitudinally. U-shaped regions 14 are arranged laterally adjacent to one another, so that an active region between adjacent U-shaped regions also extends longitudinally. This active region will be referred to as the device region 30 since this is used to form the device.

Next, a phosphorous (or arsenic) implantation is carried out to lightly dope an n-type drain forming region 19 at the drain end of the device in a first mask region 20. The mask region 20 is shown using dotted lines in FIG. 3 to indicate where the implantation is carried out. In the finished device, the drain forming region 19 will form the extended drain 50, and also with further implantation the drain 42.

Note that the description refers to first, second, third etc. mask regions. Typically, these are regions of a first mask, a second mask, and a third mask etc. respectively. Those skilled in the art will be aware of a number of approaches to ensure patterning in accordance with regions of a mask, for example by using photolithography, and accordingly further details of such patterning will be omitted.

The implantation is carried out with an implant normally used to increase channel doping and thus the threshold voltage in PMOS transistors, and so again is a standard process step. In the process used in the example, the dose is $5\times10^{12}$ cm$^{-2}$, though this will of course be dependent on the standard process used.

The other end of the device is doped p-type in a body forming region 21 using a second mask region 22 (FIG. 4)—this will, in the finished device, form the body region 46 so the step normally used for forming CMOS body doping is used.

Figure 4:
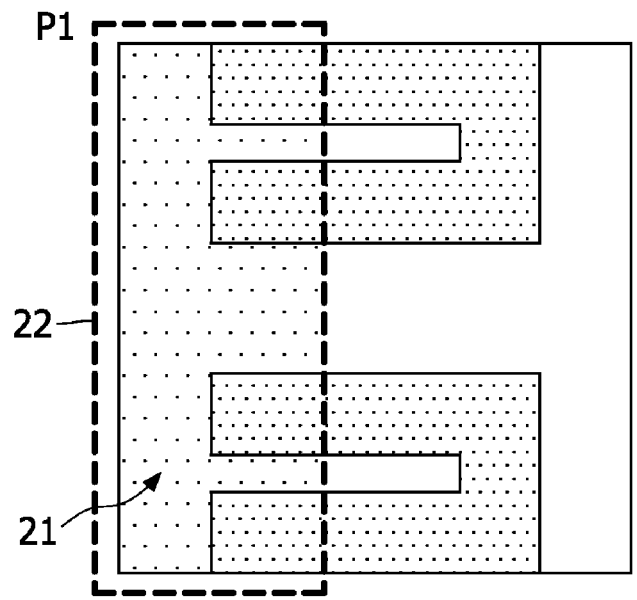
FIG. 4 shows a top view of a further stage in the method of the first embodiment.
Figure 5:
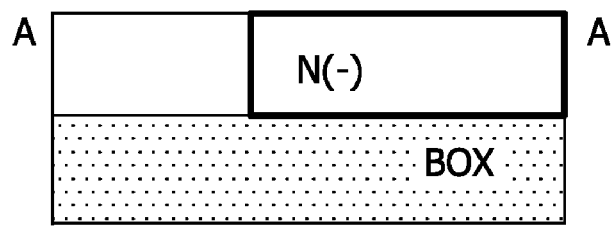
FIGS. 5 and 6 show sections through the stage of FIG. 4 along lines A-A and B-B respectively.
Figure 6:
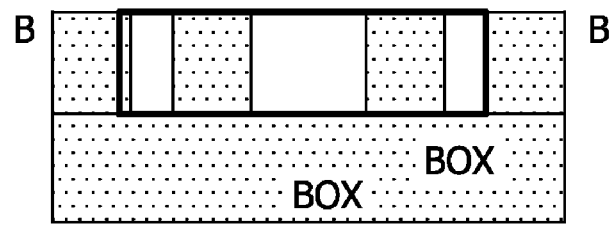

These steps lead to the stage shown in top view in FIG. 4 and in side view in FIG. 5 (along line A-A in FIG. 1) and FIG. 6 (along line B-B in FIG. 1).

A gate oxide layer 24 is then formed over the device, and polysilicon deposited to form the gate 26. Note that the gate 26 extends laterally over the device region 30, and partially over the U-shaped insulating region 14, but not over the field region 28.

Figure 7:
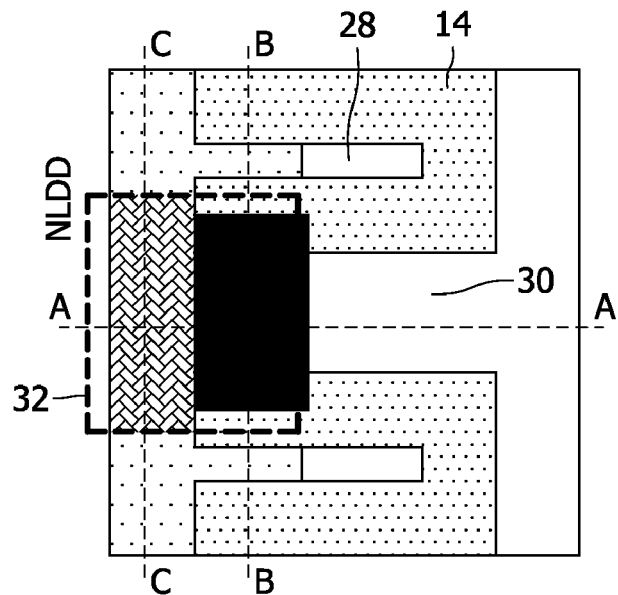
FIG. 7 shows a top view of a further stage in the method of the first embodiment.
Figure 8:
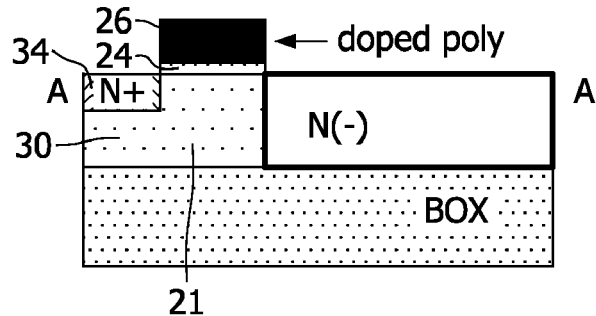
FIGS. 8 to 10 show sections through the stage of FIG. 7.
Figure 9:
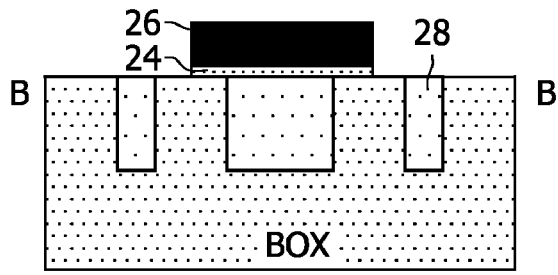
Figure 10:
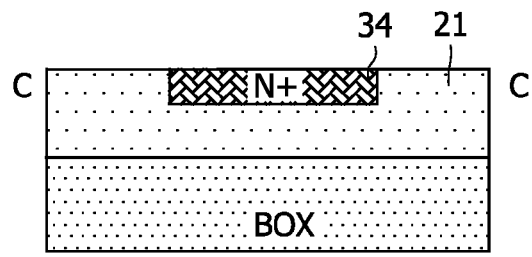

A single doping step is then used to n-type dope a third mask region 32 (FIG. 7), including the end of the device region 30 and the gate 26, to dope the polysilicon gate 26. The doping step also dopes the top of the device region at one end of the device to form thin source region 34. This step is normally used in conventional CMOS processing to form an n-type source/drain extension doping structure, also known as a lightly doped drain or lightly doped source (LDD/LDS) structure.

Boron pocket implants (not shown) may optionally be used at this time.

This results in the device structure illustrated in FIGS. 7 to 10.

Figure 11:
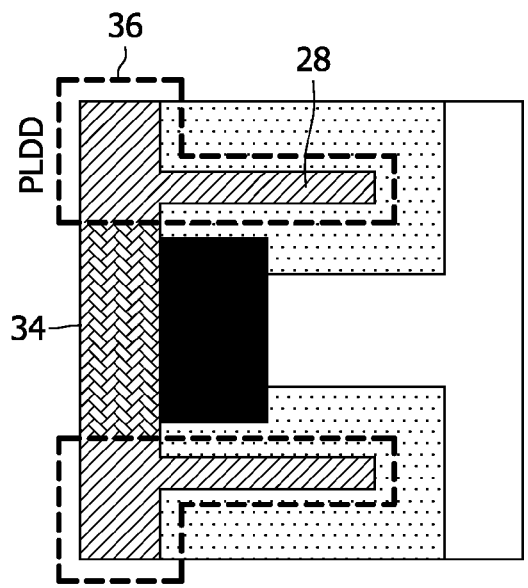
FIG. 11 shows a top view of a further stage in the method of the first embodiment.

Next, a fourth mask region 36 is used to dope the tops of the field regions 28 strongly p-type with a boron implant (FIG. 11). The process used is the same as that used in conventional CMOS processes to form a p-type source/drain extension doping structure region of transistors, which also requires a shallow doping step.

Phosphorous pocket implants (not shown) may optionally be used at this time.

Figure 12:
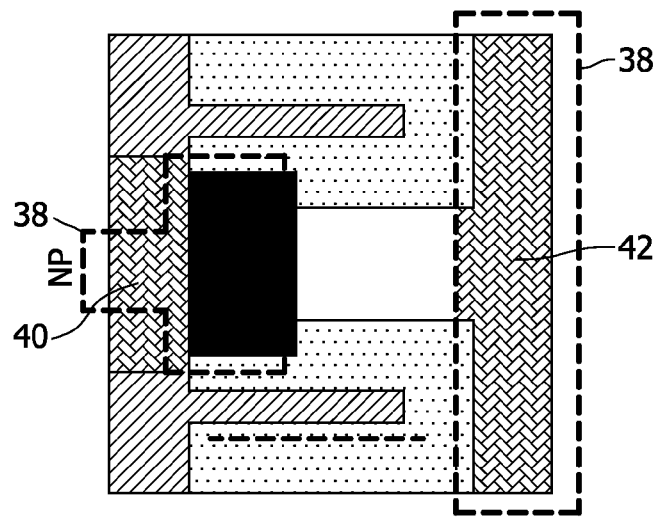
FIG. 12 shows a top view of a further stage in the method of the first embodiment.

A fifth mask region 38 is used to implant a drain region 42 (FIG. 12) and a thick source region 40, both strongly n-type (n++). This uses a step used to implant highly doped n-type highly doped drain and source structures in conventional CMOS to form the NMOS transistors in those structures. In this step, an arsenic dopant is used through the full thickness of the silicon device layer 10. The body region 46 is defined in this step as the remainder of the body-forming region 21 that has not been doped in another step. Likewise, the extended drain 50 is defined as the remainder of the drain forming region 19 that is not heavily doped to form the drain region 42. The extended drain region 50 is also known as a drift region.

The source region is formed of the thin source region 34 and the thick source region 40 to have a relatively complex shape—the thick source region 40 is laterally narrow and the thin source region 34 relatively wide so that the body region 46 extends under the thin source region 34 where the thick source region 40 is absent. This allows connection to occur to the body region in the next step.

Figure 13:
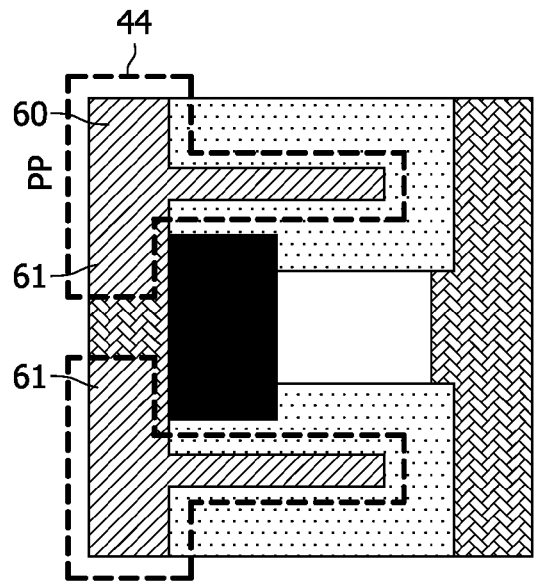
FIG. 13 shows a top view of a further stage in the method of the first embodiment.
Figure 14:
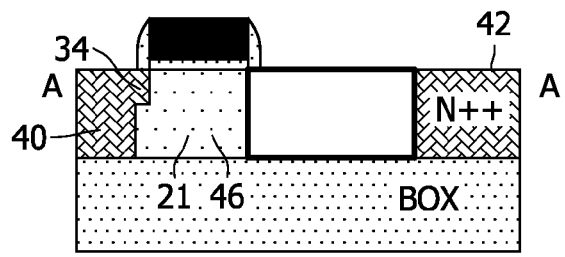
FIG. 14 shows a section through the stage of FIG. 13 along line A-A.

A sixth mask region 44 (FIG. 13) is used to dope the complete thickness of the silicon device region strongly p type (p+) in a p+ doped region 60, resulting in the structure shown in FIGS. 13 and 14. This is the step normally used to form p-type source and drain structures in conventional CMOS, for forming the PMOS transistors.

Note that the shapes of the third, fourth, fifth and sixth mask regions ensure that there is a body contact. The body region 46 extends under the thin source region 34 to body contact region 61, which is part of the p+ doped region 60 and avoids a floating body.

Note that the same doping step using the sixth mask region 44 is used to dope the full thickness of the field regions 28 strongly p+ type as well.

Figure 15:
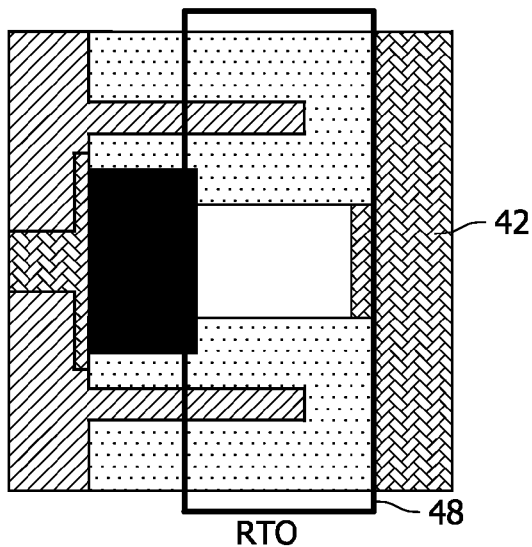
FIG. 15 shows a top view of a further stage in the method of the first embodiment.
Figure 16:
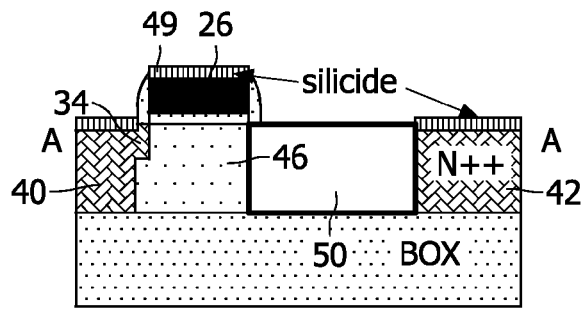
FIGS. 16 to 18 show sections through the stage of FIG. 13.
Figure 17:
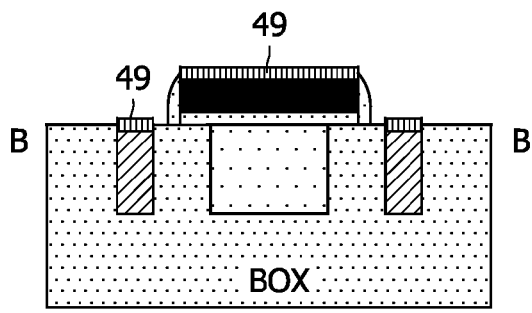
Figure 18:
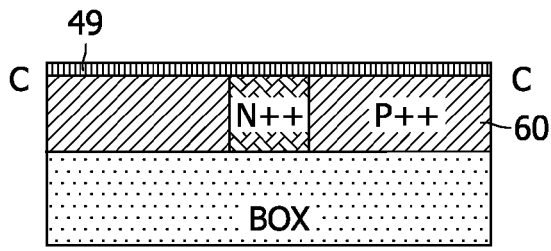

A seventh mask region 48 (FIG. 15) is then used to shield the extended drain region 50, which is the region between the body region 46 and the drain region 42, while siliciding the top of the polysilicon gate 26, source region 34 and drain region 42 with silicide 49. This results in the structure of FIGS. 15 to 18.

In the embodiment shown, the extended drain region 50 has a length of 2 μm, and a doping of $1\times10^{17}$ cm$^{-3}$. The extended drain region 50 and body region 46 both have a width of 100 nm between the insulated trenches 14, the width of the field plates 28 is 80 nm and the width of the trenches 14 is 200 nm. Such sizes are achievable in modern, standard CMOS processes. The silicon device layer 10 has a thickness of 60 nm.

Those skilled in the art will realize that alternative sizes and doping levels can be used if required. Also, alternative shapes are possible. In this example, the field plates 28 are doped heavily p-type and connected to the p-type body contact 58. However, the field plates 28 could also be doped heavily n-type and connected instead to the source and source contact 54. This will require rearrangement of the mask shapes, especially thin source region 34, to maintain contact of body contact 58 to the p-type body 46.

Figure 19:
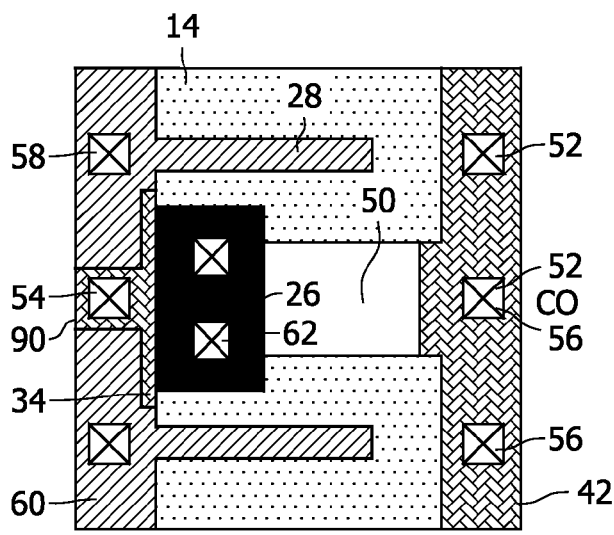
FIG. 19 shows a top view of a further stage in the method of the first embodiment.
Figure 20:
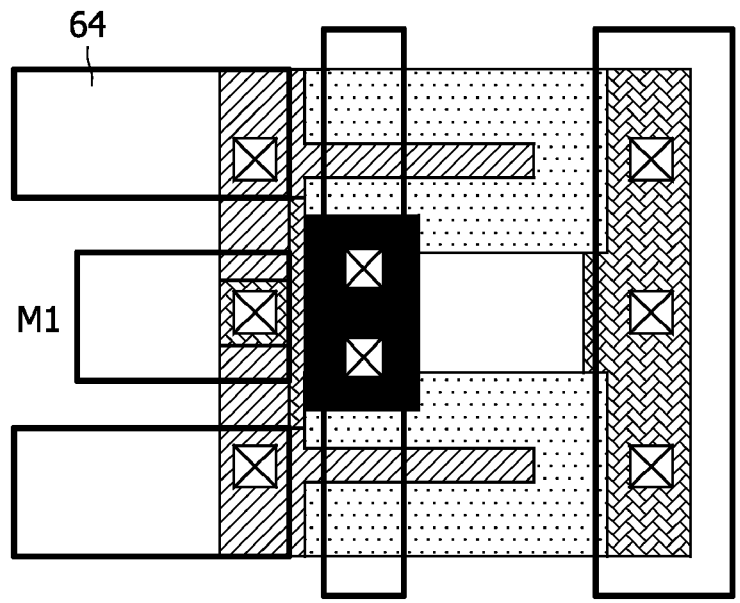
FIG. 20 shows a top view of a final stage in the method of the first embodiment.

Contacts 52 are then formed (FIG. 19) using a contact mask to form a source contact 54 in contact with the source region 34, 40, drain contact 56 in contact with drain region 42, p-type contact 58 in contact with the strongly doped p-type region 60 connected to the field regions 28, and gate contact 62 in contact with the gate 26. Metallisations 64 are then formed in the pattern shown in FIG. 20.

Note that in the above embodiment the gate contact 62 is directly on top of the gate above the body region 46, which is unusual and limits the length of the gate.

In use, the transistor operates as a relatively high voltage transistor. Voltage can be applied to the p-type contact 58 to the strongly doped p-type region to apply a voltage to the field regions 28 which ensures that the extended drain region 50 adjacent to the field regions 28 is depleted when the transistor is off and conducting when the transistor is on.

Figure 21:
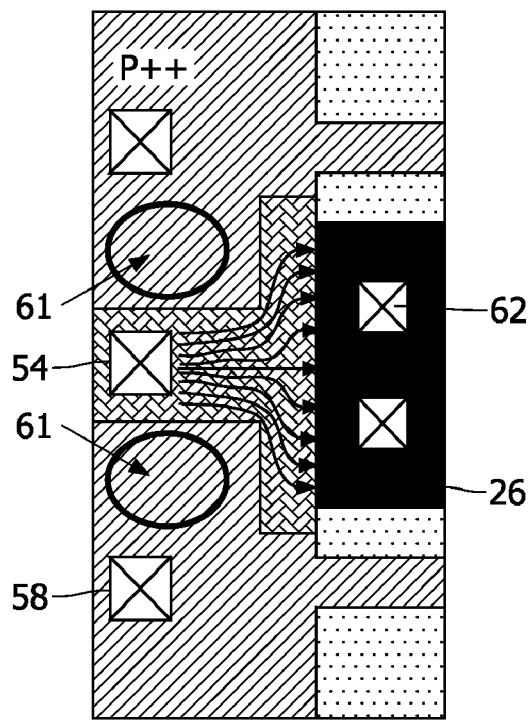
FIG. 21 shows the detail of current flow through a transistor according to the first embodiment.

FIG. 21 shows the current flow with the transistor on from source contact 54 to the body region under gate 26. Regions 61 where the p+ type doped region 60 is in contact with the body are also shown. The relatively complex shape of the source region 34,40 ensures a good flow from source contact 54 under the gate 26 at the same time as ensuring a good connection to the p-type body 46 avoiding the problems of a floating body.

Calculations show that the transistor has a breakdown voltage of 50V with an on-resistance of 50 mΩmm$^2$. This is as good as the best devices manufactured with specialist structures and process steps, even though all steps can be carried out on a conventional CMOS line.

Figure 22:
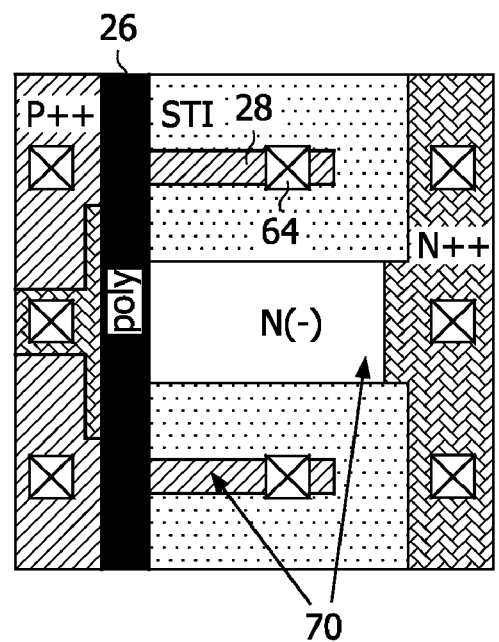
FIG. 22 shows a top view illustrating a second embodiment of the invention.

FIG. 22 illustrates an alternative embodiment which avoids the need to contact the gate in the active region of the device. Gate 26 extends across the full width of the device. Field plate contacts 64 are used to connect to the field regions 28 so that they are connected even when the gate has a voltage applied.

This embodiment is particularly suitable for producing narrow (short) gates.

Figure 23:
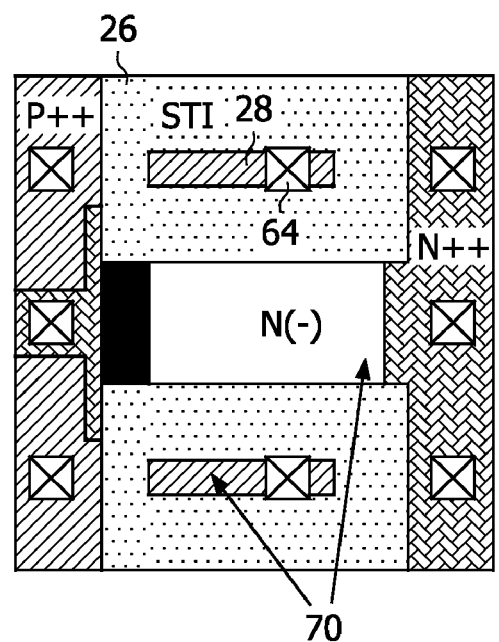
FIG. 23 shows a top view illustrating a third embodiment of the invention.

In an alternative form of the invention, illustrated in FIG. 23, ring shaped insulating regions 14 are formed instead of the U-shaped regions described above. Again, field plate contacts 64 are used.

In this embodiment, it is possible to control the voltage on the field regions 28 independently to further control the device.

Figure 24:
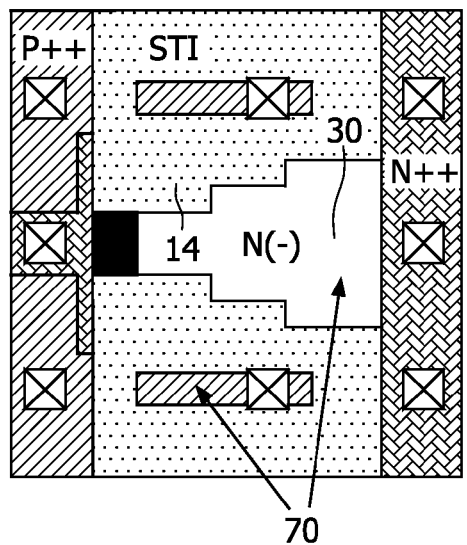
FIG. 24 shows a top view illustrating a fourth embodiment of the invention.

A number of options are available to still further improve device performance. One is to taper device region 30 and insulating regions 14. This refinement is illustrated in FIG. 24, which shows U-shaped insulating regions 14 of variable width. An alternative approach is to taper device region 30 whilst ensuring that the insulating regions 14 have constant width—this requires tapering the field regions 28. A further possibility is to have device region 30 of constant width, tapering the insulating regions 14, again tapering the field regions.

Figure 25:
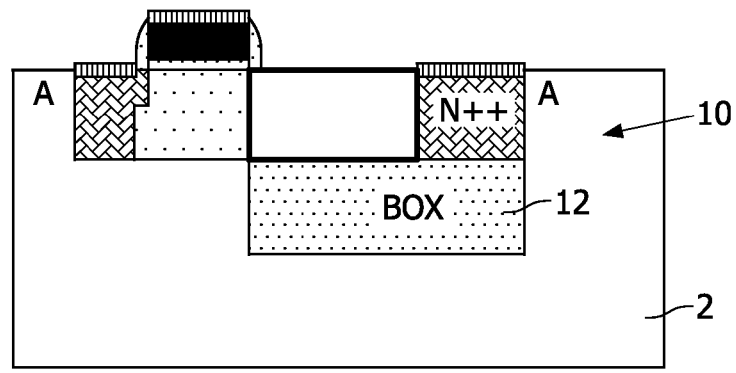
FIG. 25 shows a side view illustrating a fifth embodiment of the invention.

In the above embodiments, the insulating layer 12 may be either an insulating layer extending over the whole substrate 2 or alternatively a buried insulating layer extending only under the power transistor but not the rest of the substrate. However, there is a further possibility; the insulating layer 12 can be formed only under the drain and extended drain regions. This is illustrated in FIG. 25 in which the insulating layer 12 extends under only part of the device, the drain region 42 and extended drain region 50 of the silicon device layer 10.

Figure 26:
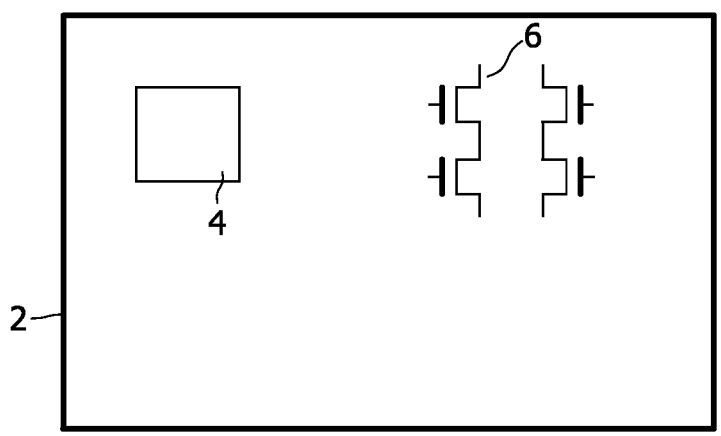
FIG. 26 shows a top view illustrating a sixth embodiment of the invention.

All of the above embodiments use standard processing steps. Accordingly, they can be used to form a FET 4 as described above as well as a plurality of conventional CMOS components 6 as illustrated schematically in FIG. 26. The various process steps indicated above are used in their standard ways for the CMOS components 6 as well as as discussed above for the FET 4. For example, the step described above as using a standard processing step normally used for forming a CMOS body is in fact additionally used for forming the CMOS body in the CMOS components 6. The high voltage component 4 is formed in region 72. Indeed, the region 72 may include more than one such high voltage component 4; alternatively, many regions 72 may be provided.

Thus, for example the fourth mask discussed above in the process for forming the high voltage device may also define p-type LDD regions in conventional CMOS components. The third mask discussed above may also be used to form n-type LDD regions in the conventional CMOS components. A single mask is used to carry out the definition of the p-type LDD regions in the CMOS components and the step as described above for the fourth mask region. Likewise, the fifth and sixth masks define n-type and p-type HDD regions in the conventional components.

In the above embodiments, an insulating layer 12 is used to isolate devices. However, in alternative embodiments such a layer is omitted and isolation is achieved in different ways.

In a further embodiment, a substrate 2 is the starting point. A thin oxide layer 100 is formed over the substrate, followed by a nitride layer 102.

Figure 27:
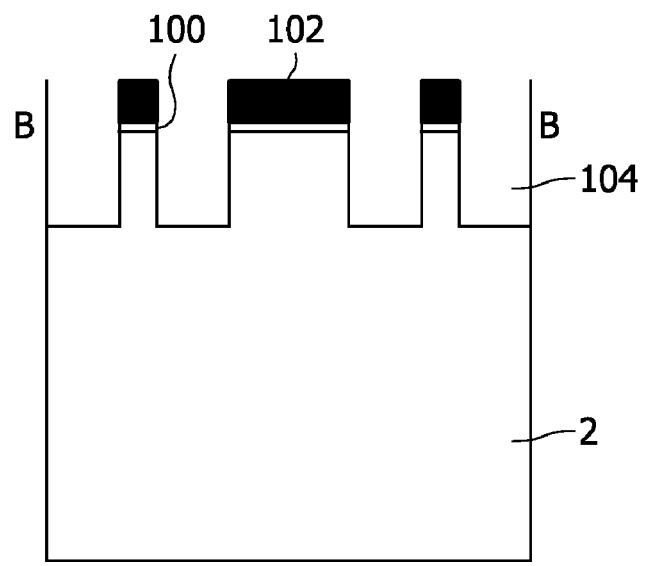
FIGS. 27 to 33 show views illustrating a seventh embodiment of the invention.

Next, a shallow trench isolation step is carried out using the same mask shape as used in FIG. 1 defining U-shaped regions in the form of shallow trenches 104. This mask is a high-definition mask and deep-UV lithography is used. The same mask is used to form the shallow trench isolation of any conventional CMOS devices formed on the same substrate, resulting in the device shown in side view along B-B in FIG. 27.

Figure 28:
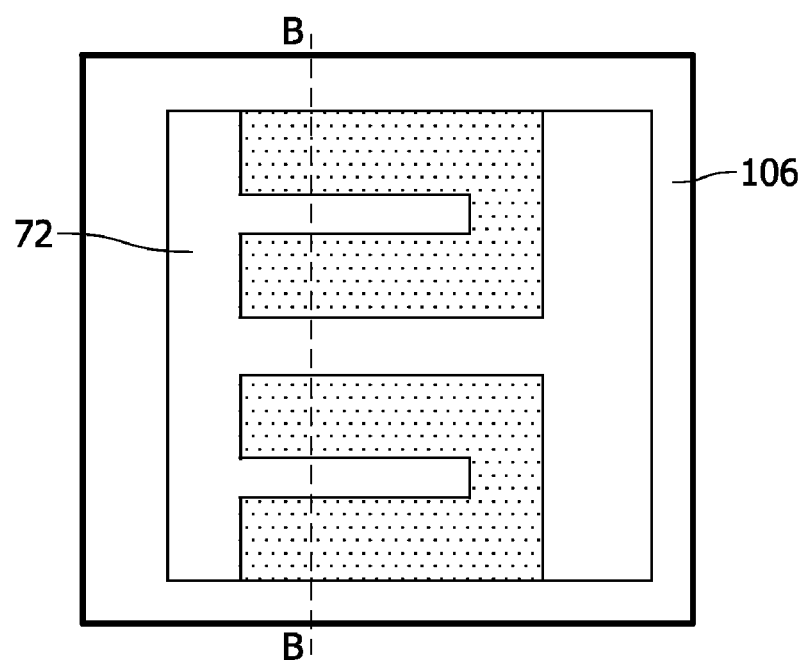

Next, a photoresist mask 106 is used to define a region 72 for the high voltage devices in which the trenches are to be etched to be deeper. These deeper trenches in region 72 will result in improved isolation between the grounded plate and the extended drain region in this region 72. FIG. 28 shows a top view of mask 106 and region 72.

Figure 29:
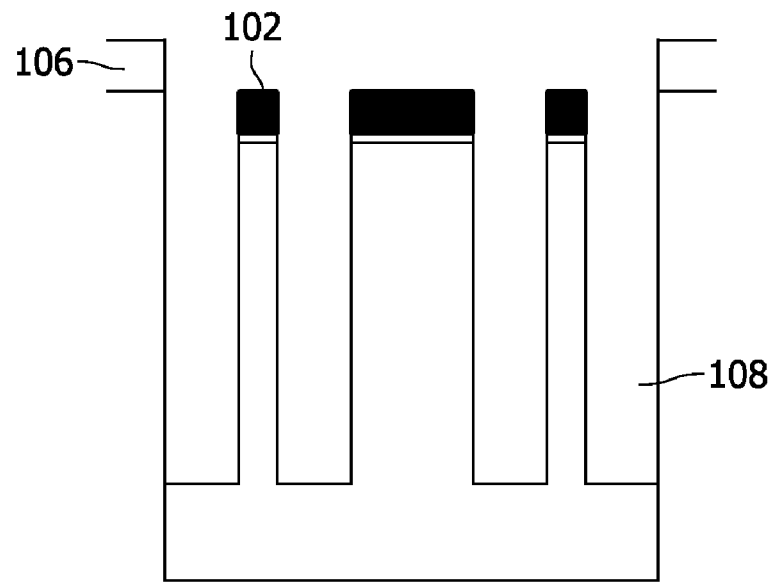

A deep trench etch step is then carried out using a dry etch process that is selective to photoresist and silicon nitride, resulting in the deep trenches 108 shown in side view in FIG. 29. The deep trenches may have a thickness of 1 µm to 20 µm, preferably above 2 µm further preferably above 4 µm and preferably below 10 µm. As a rule of thumb, each 1 µm of depth allows approximately 2×20V to be sustained.

The photoresist is then stripped which will leave the deep trenches 108 exposed as well as any shallow trenches 104 that were covered by the photoresist mask.

A filling step is then carried out by depositing oxide in the trenches. In the embodiment, this is carried out by filling the trenches using a tetraethylorthosilicate (TEOS) process to form a so-called TEOS oxide 110. Note that the term TEOS is used here in its conventional meaning in the art a meaning an oxide formed from TEOS. The TEOS will also forms TEOS oxide 110 above the nitride layer 102.

Figure 30:
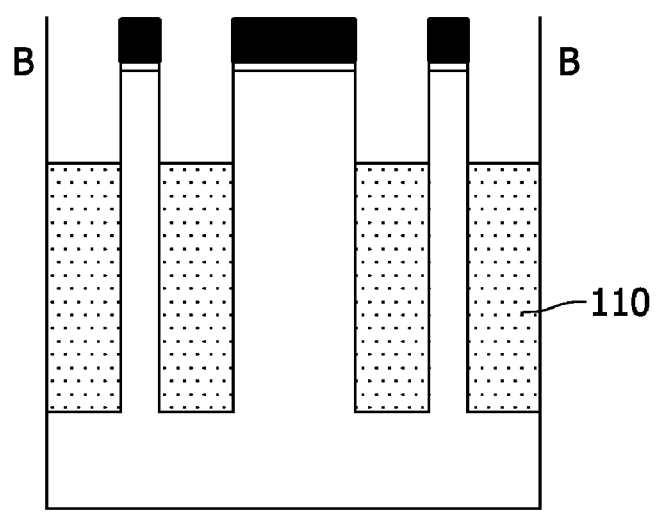

Next, a dry or wet etching step is used to etch back the TEOS layer 110 to remove it from any shallow trenches 104 that were covered by photoresist mask 106 and hence not deepened and also to remove the TEOS layer on the top of the device above nitride layer 102. This step also recesses the TEOS layer 110 in the deep trenches 108. The result is shown in side view in FIG. 30.

Figure 31:
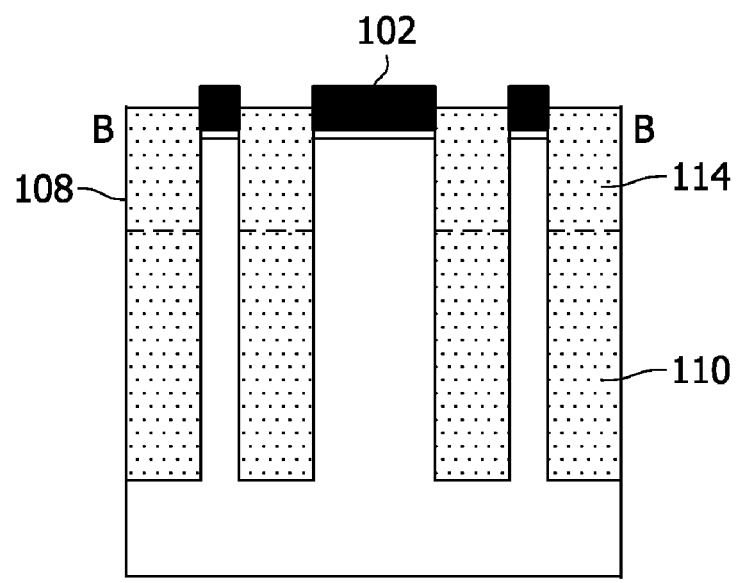

A non-conformal HDP oxide deposition step is then carried out to deposit HDP oxide 114 in the shallow trenches and also filling the top of any deep trenches 108 with the HDP oxide 114. A chemical mechanical polishing (CMP) etching step is then carried out to remove excess oxide 114 from the surface. Then, a short wet etch is carried out to slightly recess the oxide 114 to approximately the upper silicon level, as illustrated in FIG. 31.

TEOS is a conformally deposited oxide and thus very suitable for filling relatively deep and relatively narrow trenches. Since deposition occurs on sidewalls, a relatively thin layer is sufficient for filling deep trench. Because of the deposition conformality, the surface is essentially planar which makes CMP difficult.

In contrast, HDP oxide, which is used to fill shallow trench isolation (STI) structures in a conventional CMOS process is non-conformally deposited, i.e. it fills the trench from the bottom up. For this reason, a very thick layer is needed to fill a deep trench with HDP oxide. HDP oxide is thus suitable for filling wide and relatively shallow trenches (like STI). Further, CMP process can be easily applied, since topography is preserved.

The wet etch rate (e.g. using a wet etchant of 2% HF), is slow for HDP, but very fast for TEOS. HF2% chemistry is used in many cleaning operations in standard CMOS and thus HDP filling of STI is again preferred to avoid recess of oxide in STI during subsequent processing. In summary, TEOS is preferred for filling deep trenches, but not so suitable for filling standard STI for integration reasons and CMOS compatibility.

Thus, although it might appear to add complexity to the process, the combination of both TEOS oxide and HDP oxide is preferred for manufacturing.

Figure 32:
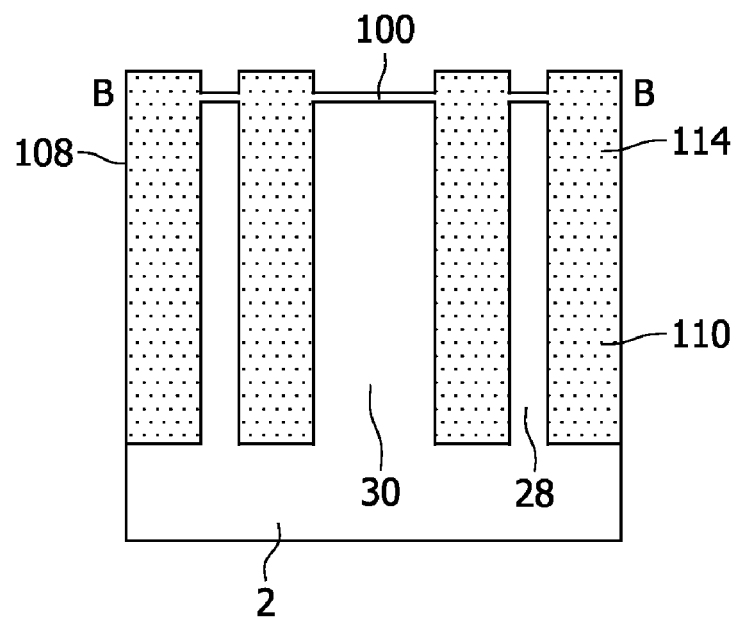

Then, the nitride is removed using a wet etch resulting in the result of FIG. 32.

Processing then continues as in the first embodiment starting from the starting point illustrated in FIGS. 1 and 2. The deep trenches 108 mean that even in the absence of the buried oxide layer 12 of FIG. 1, the extended drain regions are isolated from the field plates.

Figure 33:
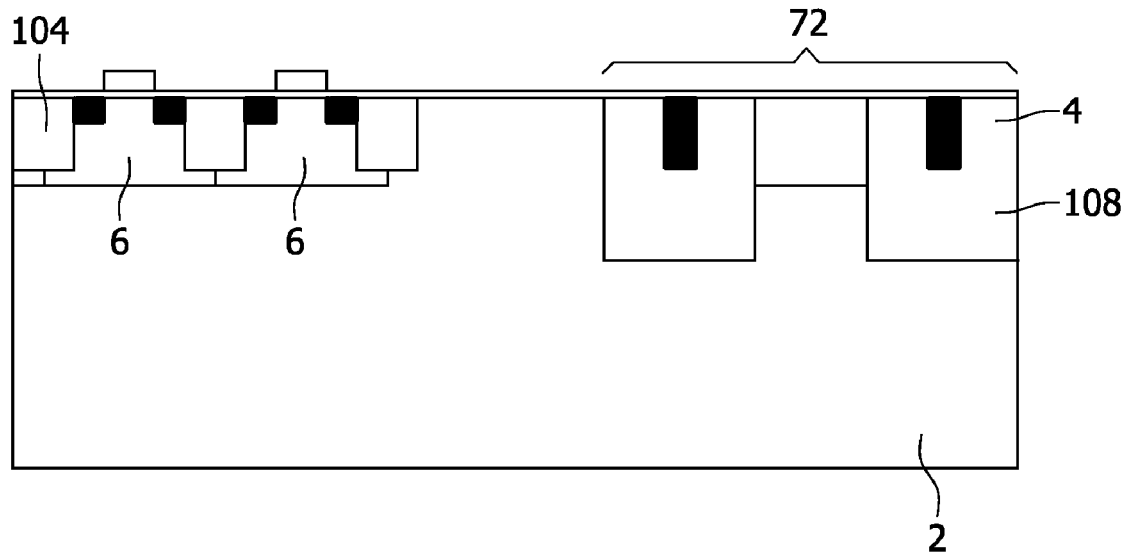

FIG. 33 illustrates the device in side view with both conventional components 6 and high voltage components 4. The deep trenches 108 are only present in the high voltage region 72; the conventional components only have conventional shallow trench isolation structures formed in shallow trenches 104 and so the conventional properties are not adversely affected.

This embodiment accordingly reduces the cost of the devices made in accordance with the invention since it avoids the need for relatively expensive SOI wafers. Further, there is no need to carry out process steps on SOI wafers, instead an absolutely standard process can be used on standard wafers which increases the general applicability of the process since the process does not require capability of processing SOI wafers.

Further, the omission of the oxide layer 12 can increase the heat dissipation properties of the device.

This alternative embodiment accordingly allows many power management or power amplification applications that would not otherwise be possible.

A further embodiment will now be described with reference to FIGS. 34 to 37 which uses an alternative approach to avoid the need for a buried oxide layer 12. The starting point is that of FIG. 27 in which nitride layer 102 is deposited over substrate 2 and the shallow trench isolation step carried out to define the U-shaped regions 14 of FIG. 1.

Figure 34:
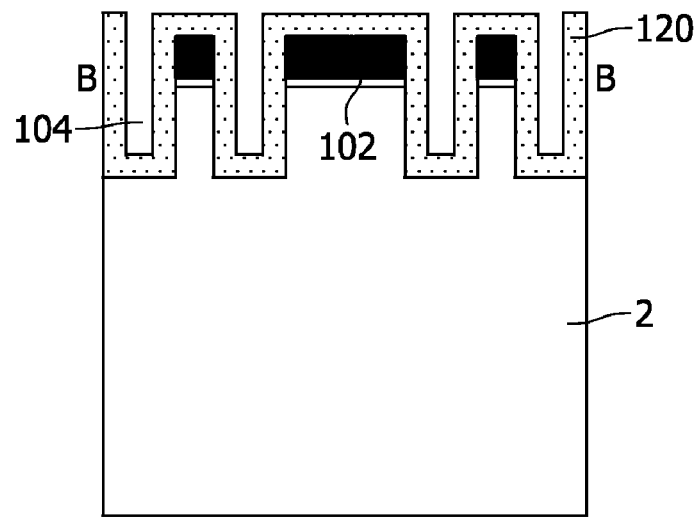
FIGS. 34 to 37 show views illustrating an eighth embodiment of the invention.

In this further embodiment, processing then continues by depositing a thin protection layer, for example oxide 120, over the nitride and in the shallow trenches as illustrated in FIG. 34.

A high voltage photoresist mask 106 is then used to define a high voltage region 72 in a similar way to the previous embodiment. As before, this mask need not be a high resolution mask.

Figure 35:
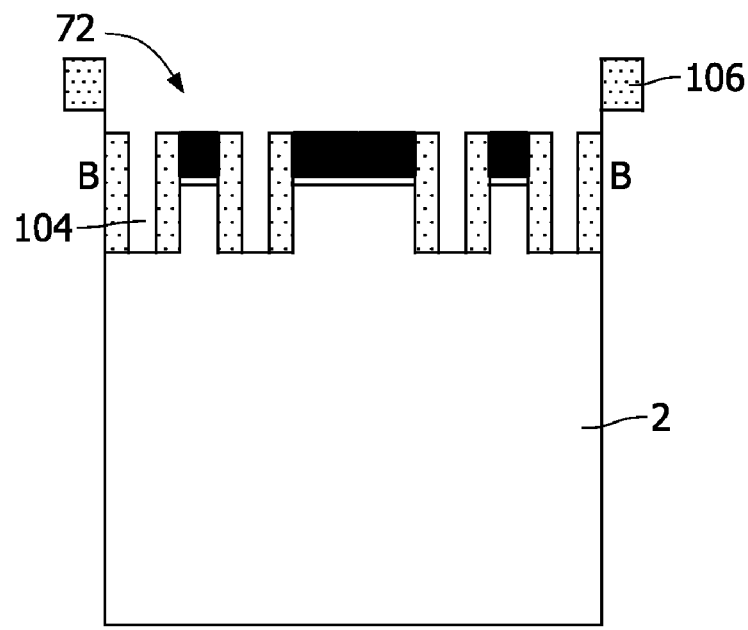

An oxide dry etch is then carried out to remove oxide from the tops of the device and also from the base of the shallow trenches 104 as illustrated in FIG. 35.

An optional trench etch is then carried out to deepen the shallow trenches 104.

Figure 36:
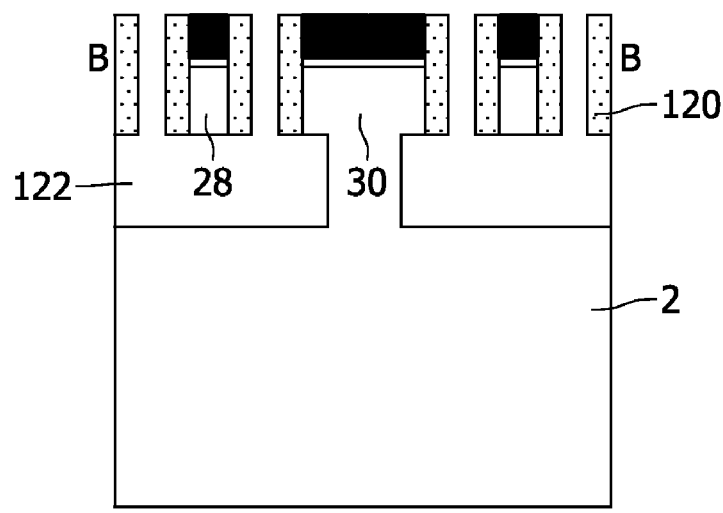

Whether or not the optional trench etch is then carried out, a further isotropic etch is then carried out to underetch the fingers 28 by forming cavities 122 as illustrated in FIG. 36.

An oxide fill step is then carried out using one of a number of approaches. In particular, either conformal deposition (TEOS) or bottom up filling (HDP) or both may be used to fill the cavities with oxide 124.

It is not necessary to fill with oxide—alternative insulating material may also be used.

Figure 37:
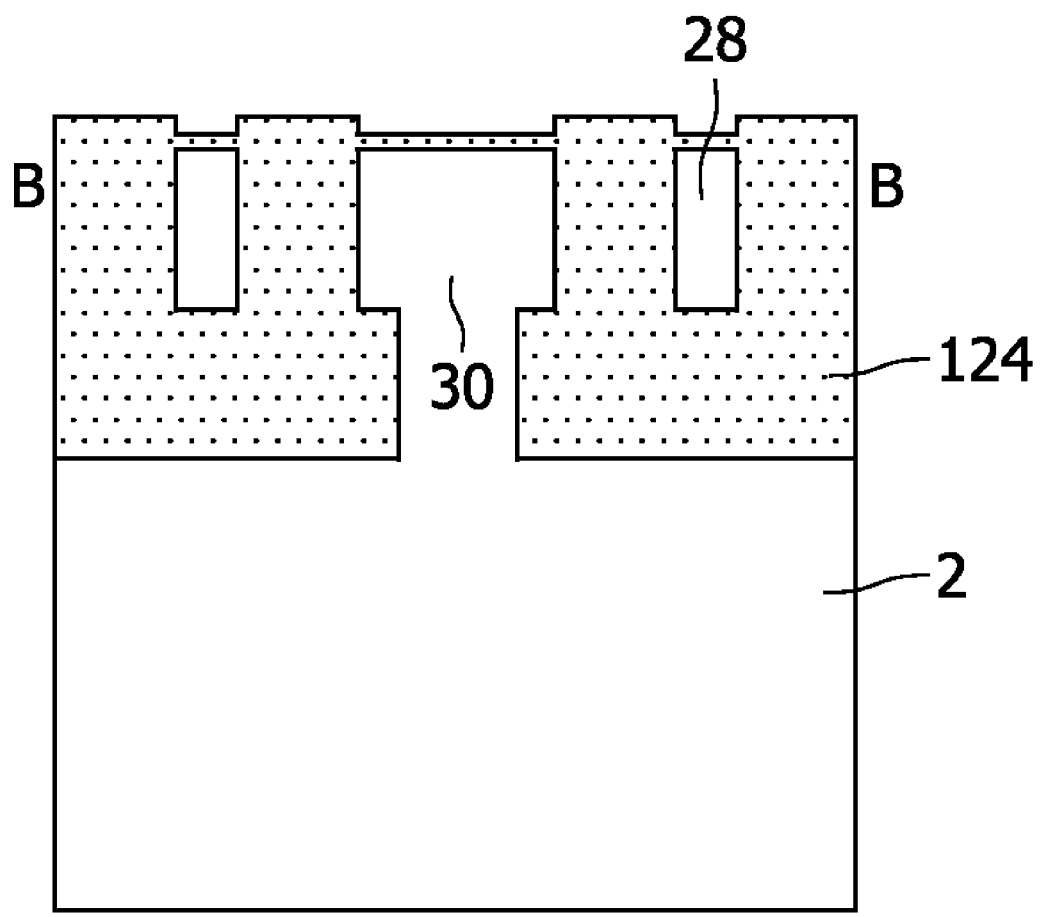

A planarization step is then carried out followed by a nitride removal wet etch resulting in the structure shown in FIG. 37.

Figure 3:
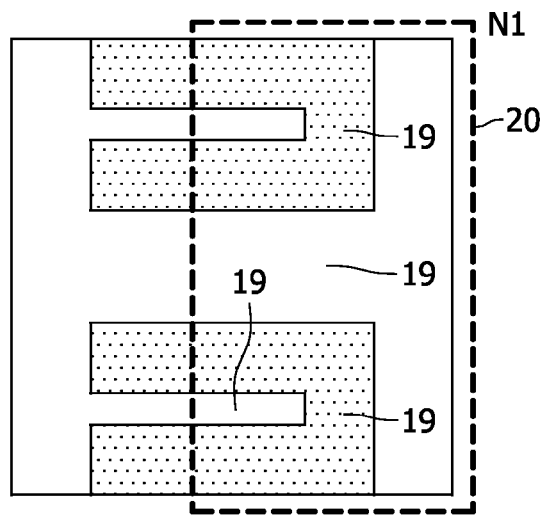
FIG. 3 shows a top view of a further stage in the method of the first embodiment.

Processing then continues as in the first embodiment starting at the step illustrated with regard to FIG. 3.

Similar advantages are obtained as in the arrangement of FIGS. 27 to 33.

Another approach uses nitride (anti-oxidizing layer) as the protection layer 120. Then the same steps as described above (FIG. 34 to 37) are carried out up to and including the deeper trench etch. Then instead of isotropic silicon etch, oxidation is performed to completely underoxidize the field plate regions, the other areas being protected with nitride layer 120.

Note that although the arrangements of FIGS. 27 to 33 and FIGS. 34 to 37 use a single high resolution mask and a lower resolution mask, it is also possible to use a pair of high resolution masks. Alternative steps may be carried out as will be appreciated by those skilled in the art.

Those skilled in the art will realise that the n-type and p-type regions discussed above may be interchanged to form a PMOS transistor instead of an NMOS transistor. Other forms of transistor, including junction FETs and bipolar NPN or PNP transistors can also benefit from the field regions enabling high voltages on drain and collector respectively.

Those skilled in the art will appreciate how to modify lengths, widths and doping levels as required to provide devices with different properties, such as different breakdown voltages, on-resistances, and sizes. Indeed, it is a particular benefit of the invention that different devices can be produced simply by changing masks in a standard process, which is much easier than designing or redesigning non-standard process steps.

For example, if required the extended drain region could be doped to optimal level using dedicated implantation step.

The mask steps used can be changed as required—in particular, if different standard processing steps are available in a particular standard process, these may be used instead of the steps indicated above.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein.

Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

The invention claimed is:

1. A method of manufacturing a semiconductor device, the method comprising:
   providing a substrate with a silicon device layer;
   forming a plurality of trenches filled with insulator, the plurality of trenches enclosing field regions of the silicon device layer extending longitudinally;
   processing the field regions of the silicon device layer to be conductive so that the field regions form longitudinal field plates;
   forming an active device extending longitudinally adjacent to the trenches and separated from the field regions by the trenches filled with insulator, the active device including a body region being adjacent to a source region and an extended drain region extending longitudinally between the body region and the drain region past the field regions and separated from the field regions by the trenches filled with insulator, by
   doping a body-forming region throughout the thickness of the silicon device layer to have a first conductivity type, wherein the body-forming region includes at least a body region in a finished device;

doping a shallow source region to a depth less than the thickness of the silicon device layer to have a second conductivity type opposite the first conductivity type to form the shallow source region over part of the body-forming region;

forming a drain region by strongly doping the drain region to be conductive, leaving the region between the drain region and the body-forming region as an extended drain region and the body-forming region between the source region and the extended drain region forms the body region;

forming an insulated gate over the body region;

doping a contact region through the full thickness of the semiconductor device layer including a body contact region laterally adjacent to the deep source region to be of the first conductivity type to form a conductive contact region contacting the body-forming region and forming an electrical connection to the body region formed from the body-forming region in the active device leaving the shallow source region adjacent to the insulated gate;

wherein in the step of forming the drain region a deep source region is formed throughout the thickness of the silicon device layer and in contact with the shallow source region so that the deep and shallow source regions form together the source region; and the shallow source region is of greater width than the deep source region of a first major surface, between the deep source region and the insulated gate.

2. A method according to claim 1 wherein the substrate includes a silicon device layer above an insulating layer and the step of forming a plurality of trenches forms the trenches through the complete thickness of the silicon device layer to the insulating layer.

3. A method according to claim 1 further comprising, after forming the plurality of trenches enclosing field regions the steps of deepening the trenches to form deep trenches and filling the deep trenches with insulators.

4. A method according to claim 3 including a step of depositing a nitride layer before forming the plurality of trenches enclosing field regions, wherein the step of forming the plurality of trenches etches the nitride layer and the substrate under the nitride layer, wherein the step of deepening the trenches includes using the nitride layer as a mask.

5. A method according to claim 3 wherein the step of deepening the trenches to form deep trenches forms cavities underlying the field regions and wherein the step of filling the deep trenches with insulator fills the cavities.

6. A method according to claim 1 wherein the step of processing the field regions comprises heavily doping the field regions to render the field regions conductive.

7. A method according to claim 1, wherein the step of processing the field regions comprises siliciding the field regions to render the field regions conductive.

8. A method according to claim 1, wherein the thickness of the silicon device layer is 200 nm or less, the width of the field regions is 150 nm or less and the width of the trenches is 500 nm or less.

9. A method according to claim 1 further comprising forming field plate contacts in contact with the field regions.

10. A method according to claim 1 further comprising forming a plurality of conventional active CMOS devices on the same substrate.

11. A method according to claim 10 wherein the same steps are used to form the power FET and the plurality of conventional active CMOS devices.

12. A semiconductor device comprising:
a silicon semiconductor device layer;
an active device extending longitudinally in the silicon semiconductor device layer;
an insulated gate over a body region; and
insulated trenches surrounding field regions extending longitudinally adjacent to the active device;
wherein the field regions are formed of the silicon of the silicon device layer, the field regions being conductive by virtue of their doping or silicidation.
wherein the active device is a transistor including a source region, the body region, an extended drain region and a drain region arranged longitudinally in that order in the semiconductor device layer, the body region being of opposite conductivity type of the source region and the drain region; and
the field regions extend longitudinally adjacent to the extended drain region;
the source region includes a deep source region extending the full depth of the semiconductor device layer and a shallow source region of greater width than the deep source region at the first major surface, between the deep source region and the insulated gate;
the semiconductor device further comprising a conductive contact region of the same conductivity type as the body region extending through the semiconductor device layer adjacent to the deep source region, the body region extending under the shallow source region to the conductive contact region to electrically connect the body region to the conductive contact region.

13. A semiconductor device according to claim 12 further comprising a buried insulator layer below the silicon semiconductor device layer.

14. A semiconductor device according to claim 12, further comprising filled cavities extending from the insulated trenches under the field regions, the cavities being filled with insulator.

15. A semiconductor device according to claim 12, wherein the field regions are heavily doped crystalline silicon of the silicon semiconductor device layer.

16. A semiconductor device according to claim 12, wherein the field regions are silicide.

17. A semiconductor device according to claim 12 further comprising a field plate contacts to the field regions.

18. A semiconductor device according to claim 12 wherein at least one of the extended drain region and the insulated trenches adjacent to the extended drain region an tapered to have a width that varies along the longitudinal direction.

19. A semiconductor device according to claim 12 further comprising a substrate wherein the insulating layer extends under the silicon device layer at least under the extended drain region but does not extend across the whole surface of the substrate.

20. An integrated circuit including a semiconductor device according to claim 12 and a plurality of CMOS devices integrated on a single substrate.

21. An integrated circuit according to claim 20 wherein the semiconductor device includes deep insulating trenches and the plurality of CMOS devices include shallow insulating trenches.

22. A semiconductor device according to claim 12 further comprising a substrate wherein the insulating layer extends under the silicon device layer at least under the extended drain region but does not extend across the whole surface of the substrate.

23. A semiconductor device comprising:
a silicon semiconductor device layer;
an active device extending longitudinally in the silicon semiconductor device layer;
an insulated gate over a body region, the body region having a first conductivity type;
a shallow source region to a depth less than the thickness of the silicon device layer having a second conductivity type opposite the first conductivity type, the shallow source region extending over the body region;
a contact region of the first conductivity type adjacent to the shallow source region and in contact with the body region forming an electrical connection to the body region; and
insulated trenches surrounding field regions extending longitudinally adjacent to the active device;
wherein the field regions are formed of the silicon device layer, the field regions being conductive by virtue of their doping or silicidation.

24. A semiconductor device according to claim 23 wherein:
the source region includes a deep source region extending the full depth of the semiconductor device layer and the shallow source region of greater width than the deep source region at a first major surface, between the deep source region and the insulated gate.

25. A semiconductor device according to claim 23, further comprising filled cavities extending from the insulated trenches under the field regions, the cavities being filled with insulator.

26. A semiconductor device according to claim 23 wherein the active device is a transistor including a source region, a body region, an extended drain region and a drain region arranged longitudinally in that order in the semiconductor device layer, the body region being of opposite conductivity type to the source region and the drain region; and
the field regions extend longitudinally adjacent to the extended drain region.

27. A method of manufacturing a semiconductor device, the method comprising:
providing a substrate with a silicon device layer;
forming a plurality of trenches filled with insulator, the plurality of trenches enclosing field regions of the silicon device layer extending longitudinally;
processing the field regions of the silicon device layer to be conductive so that the field regions form longitudinal field plates;
forming an active device layer extending longitudinally adjacent to the trenches and separated from the field regions by the trenches filled with insulator;
doping a body-forming region throughout the thickness of the silicon device layer to have a first conductivity type, wherein the body-forming region includes at least a body region in a finished device;
doping a shallow source region to a depth less than the thickness of the silicon device layer to have a second conductivity type opposite the first conductivity type to form the shallow source region over part of the body-forming region;
doping a contact region of first conductivity type adjacent to the shallow source region and in contact with the body-forming region, to form a conductive contact region contacting the body-forming region and hence forming an electrical connection to the body region formed from the body-forming region; and
forming an insulated gate over the body region.

28. A method according to claim 27 further comprising, after forming the plurality of trenches enclosing field regions the steps of deepening the trenches to form deep trenches and filling the deep trenches with insulators.

29. A method according to claim 28 including a step of depositing a nitride layer before forming the plurality of trenches enclosing field regions, wherein the step of forming the plurality of trenches etches the nitride layer and the substrate under the nitride layer, wherein the step of deepening the trenches includes using the nitride layer as a mask.

30. A method according to claim 27 including forming a drain region by strongly doping the drain region to be conductive, leaving the region between the drain region and the body-forming region as an extended drain region.

31. A method according to claim 30 wherein during the step of forming the drain region a deep source region is formed throughout the thickness of the silicon device layer and in contact with the shallow source region so that the deep and shallow source regions form together the source region and the body-forming region between the source region and the extended drain region forms the body region.

32. A method according to claim 27 wherein the step of processing the field regions comprises heavily doping the field regions to render the field regions conductive.

* * * * *